United States Patent
Selz

(10) Patent No.: US 7,106,149 B2
(45) Date of Patent: Sep. 12, 2006

(54) SWITCHABLE TUNEABLE BANDPASS FILTER WITH OPTIMIZED FREQUENCY RESPONSE

(75) Inventor: Alfred Selz, Deisslingen (DE)

(73) Assignee: Thomson Licensing, Boulogne-Billancourt (FR)

(*) Notice: Subject to any disclaimer, the term of this patent is extended or adjusted under 35 U.S.C. 154(b) by 11 days.

(21) Appl. No.: 10/756,236

(22) Filed: Jan. 13, 2004

(65) Prior Publication Data
US 2004/0145410 A1  Jul. 29, 2004

(30) Foreign Application Priority Data
Jan. 13, 2003 (DE) ................ 103 00 892

(51) Int. Cl.
*H03H 7/00* (2006.01)
*H03J 5/00* (2006.01)

(52) U.S. Cl. .............. 333/174; 333/175; 455/340

(58) Field of Classification Search .............. 333/167, 333/174, 175, 170, 171; 455/180.1, 188.1, 455/193.2, 193.3, 266, 339, 340, 191.1, 191.2, 455/191.3; 334/47, 56, 60
See application file for complete search history.

(56) References Cited

U.S. PATENT DOCUMENTS

| | | | |
|---|---|---|---|
| 4,571,560 A | | 2/1986 | Dobrovolny |
| 4,573,211 A | | 2/1986 | Kupfer |
| 5,122,878 A | * | 6/1992 | Heigl et al. .............. 455/188.1 |
| 5,640,688 A | | 6/1997 | Ruitenburg |
| 6,035,185 A | | 3/2000 | Dobrovolny et al. |
| 6,064,866 A | * | 5/2000 | Lange .................. 455/180.1 |
| 2003/0143972 A1 | | 7/2003 | Satoh |

FOREIGN PATENT DOCUMENTS

| | | |
|---|---|---|
| DE | 3212731 | 10/1983 |
| DE | 3922626 | 1/1991 |
| DE | 19509567 | 10/1995 |
| DE | 198 30 587 | 2/1999 |
| EP | 0929153 | 7/1999 |
| EP | 1349 272 | 10/2003 |
| JP | 62274908 | 11/1987 |
| WO | WO 02/054591 | 7/2002 |

OTHER PUBLICATIONS

German Search Report of Jan. 22, 2003—with English language translation.
European Search Report of Jun. 14, 2004.

* cited by examiner

*Primary Examiner*—Seungsook Ham
(74) *Attorney, Agent, or Firm*—Joseph J. Laks; Robert D. Shedd; Brian J. Cromarty

(57) ABSTRACT

In a receiver, provision is made of a tuneable switchable bandpass filter comprising a primary resonant circuit and a first secondary resonant circuit. A second secondary resonant circuit can be switched into a part of the first primary resonant circuit, thereby producing a second primary resonant circuit. By virtue of the embodiment of the primary resonant circuit, the bandpass filter is switchable in terms of frequency range with little outlay on circuitry and, on account of the individual embodiment of a first and second secondary resonant circuit with individual coupling elements, can be optimized with regard to a constant amplitude response.

8 Claims, 3 Drawing Sheets

SWITCHABLE TUNEABLE BANDPASS FILTER WITH OPTIMIZED FREQUENCY RESPONSE

This application claims the benefit under 35 U.S.C. § 119 (a) of German patent application No. 10300892.6 filed Jan. 13, 2003.

FIELD OF THE INVENTION

The invention relates to a switchable tuneable bandpass filter in accordance with the preamble of the first claim.

BACKGROUND OF THE INVENTION

In receivers which have to be tuned over a wide frequency range, such as e.g. the radio-frequency receivers in radio or television tuners, the reception range is divided into a plurality of subranges.

Present-day customary television receivers have to be able to receive signals in a range from 48 MHz to 860 MHz. The properties of components of the kind usually used in receivers lead to a limitation of the tuning range that can be achieved. The entire frequency range that can be achieved by a television receiver is therefore divided e.g. into three ranges. In this case, a first range extends from 48 to 150 MHz, a second range extends from 150 to 430 MHz, and a third range extends from 430 to 860 MHz. The tuning over the three ranges is carried out by means of a three-band or a switched two-band concept in modern receivers.

In the case of the three-band concept shown in FIG. 1, the signal received by an antenna is conducted onto three parallel branches B1, B2 and B3. Each branch is designed for a frequency range and comprises an input filter EF1, EF2 and EF3, an input amplifier A1, A2 and A3, as well as a bandpass filter BF1, BF2 and BF3. The output signals of each of these branches are passed to a respective mixer MI1, MI2, and MI3, which is assigned a respective oscillator O1, O2 and O3. An intermediate frequency can be tapped off in each case at the output of the mixers.

In order to reduce the circuitry outlay, a three-band concept in which there are only two mixers and oscillators is also employed. In the case of this concept shown in FIG. 2, one frequency range, e.g. B3, is connected to a mixer MI3 and an oscillator O3 as in the three-band concept described above. The two remaining frequency ranges B1 and B2 are firstly conducted, as in the three-band concept described above, via a respective individual branch with input filters EF1 and EF2, input amplifiers A1 and A2 and bandpass filters BF1 and BF2, wherein at the output of the bandpass filters a switch S feeds in each case one of the two branches to a common mixer MI1 and oscillator O1.

A further reduction of the circuitry outlay can be achieved by using a switched two-band concept as shown in a diagrammatic illustration in FIG. 3. As in the two concepts described above, the switched two-band concept has an individual branch comprising input filter EF3, input amplifier A3 and bandpass filter BF3 for one frequency range, e.g. B3, which is passed to a dedicated mixer MI3 and oscillator O3. The two remaining frequency ranges B1 and B2 are passed via a common branch comprising input filter EF1/2, input amplifier A1 and bandpass filter BF1/2 and fed to a dedicated mixer MI1 and oscillator O1. The properties of the input filter EF1/2 and the bandpass filter BF1/2 are switchable in the case of the switched two-band concept. As a result, the filters can be adapted to the frequency range respectively selected.

The switchable bandpass filter is embodied as an inductively reference-point-coupled two-circuit bandpass filter and is illustrated in a simplified embodiment in FIG. 4. A signal S passes from an antenna (not illustrated in FIG. 4) and an input filter (likewise not illustrated) via the input amplifier A1 to a first primary resonant circuit. The first primary resonant circuit comprises the variable capacitance C1 and the series circuit formed by the inductances L1 and L2. The switches S1 and S2 are open in this case. One connection of the inductance L2 is connected to a first connection of an inductance L3 and completes the series circuit of the first primary resonant circuit. The second connection of the inductance L3 is at a fixed potential. A first secondary resonant circuit comprising the series circuit formed by the inductances L4 and L6 as well as a variable capacitance C2 is likewise connected to the first connection of the inductance L3, so that a T-shaped arrangement is produced overall. The coupling elements RK and CK are connected to the output-side end of the bandpass filter, which coupling elements connect the bandpass filter BF1/2 to the mixer MI1. In order to switch the frequency range of the bandpass filter BF1/2, the two switches S1 and S2 may be closed. The inductances L2 and L4 are thus short-circuited and the circuit has a new common reference point inductance L5. In this case, the inductance L5 is expediently chosen to be smaller than the inductances L2 and L4, so that the components connected to these elements can subsequently be disregarded. In one exemplary embodiment, the values of the inductances differ by the factor three. The second primary resonant circuit thus produced then comprises the variable capacitance C1 and also the series circuit formed by the inductances L1 and L5. The second secondary resonant circuit comprises the series circuit formed by the inductances L6 and L5 and also the variable capacitance C2. The bandpass filter that is frequency-switched in this way furthermore remains connected to the coupling elements RK and CK and consequently connected to the mixer. The advantage of the lowest outlay compared with the first two concepts is opposed by the disadvantage that the coupling elements CK and RK can be set optimally only for one range. As a result, relatively large level differences can occur over the two frequency ranges and impair the properties of a tuner.

In order to avoid this effect, although it is possible for the coupling elements to be configured in switchable fashion, this nevertheless results in an increase in the circuitry outlay again.

For these reasons there is a need for a switchable tuneable bandpass filter which has a uniform level profile over the two frequency ranges with a low circuitry outlay.

SUMMARY OF THE INVENTION

The invention proposes for this purpose the switchable tuneable bandpass filter described below. Advantageous refinements of the invention are specified in the subclaims.

In the case of the construction of a tuner with a switchable tuneable bandpass filter according to the invention, the bandpass filter has a primary resonant circuit and two secondary resonant circuits. An input signal from an antenna passes to an input amplifier, from the output of which it is conducted to the primary resonant circuit. The primary resonant circuit is embodied in switchable fashion in such a way that in each case a first or second secondary resonant circuit can be selected. In a first switch position of the switch, a first primary resonant circuit comprises a first variable capacitance and also the series circuit formed by a first and a second inductance. The second inductance is connected to a first reference point inductance. The first secondary resonant circuit comprises a third inductance, which is likewise connected to the common first reference point inductance, and a second variable capacitance. The output of the first secondary resonant circuit is connected to a mixer by means of first coupling elements. The series circuit formed by the first and second inductances in the first primary circuit expediently has the same inductance as the third inductance in the first secondary circuit. This advantageously results in the desired T-shaped filter configuration.

In a second switch position, a second primary resonant circuit comprises the first variable capacitance and the first inductance of the first primary resonant circuit described above. The now closed switch connects the first inductance to a second common reference point inductance. A second secondary resonant circuit, comprising a fourth inductance and a third variable capacitance, is connected to the second common reference point inductance. The output of the second secondary resonant circuit is connected to the mixer by means of second coupling elements in a known manner. Since the second common reference point inductance, which takes effect when the switch is closed, is lower in value than the remaining second inductance of the first primary resonant circuit in the first switch position, the elements connected to the circuit via the remaining second inductance can be disregarded. The values of the inductances differ by the factor three, for example, other expedient ratios also being possible. A second switch for disconnecting the unrequired part of the circuit is thus superfluous.

The invention advantageously makes it possible to achieve a uniform gain response over the two switchable frequency ranges without significantly increasing the overall outlay.

In no way the invention is restricted to the application in radio and television tuners; rather, it can be used wherever a large frequency range to be received is subdivided into a plurality of bands for the realization of a receiver. This may include, inter alia, satellite receivers or receivers for wireless data networks.

The invention is explained in more detail below with reference to the circuit sketches of an exemplary embodiment.

BRIEF DESCRIPTION OF THE DRAWINGS

In the figures:

In the figures, identical reference symbols designate identical or similar elements.

FIGS. 1 to 4 have been explained above in the description of the prior art.

DETAILED DESCRIPTION OF PREFERRED EMBODIMENTS

Figure 1:
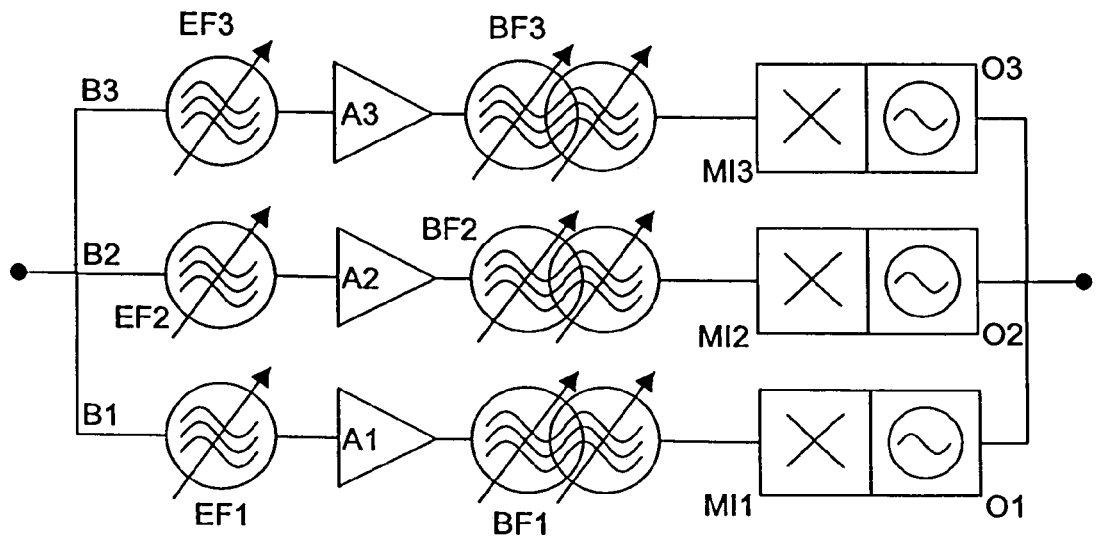
FIG. 1 shows the basic illustration of a three-band concept as is known from the prior art.
Figure 2:
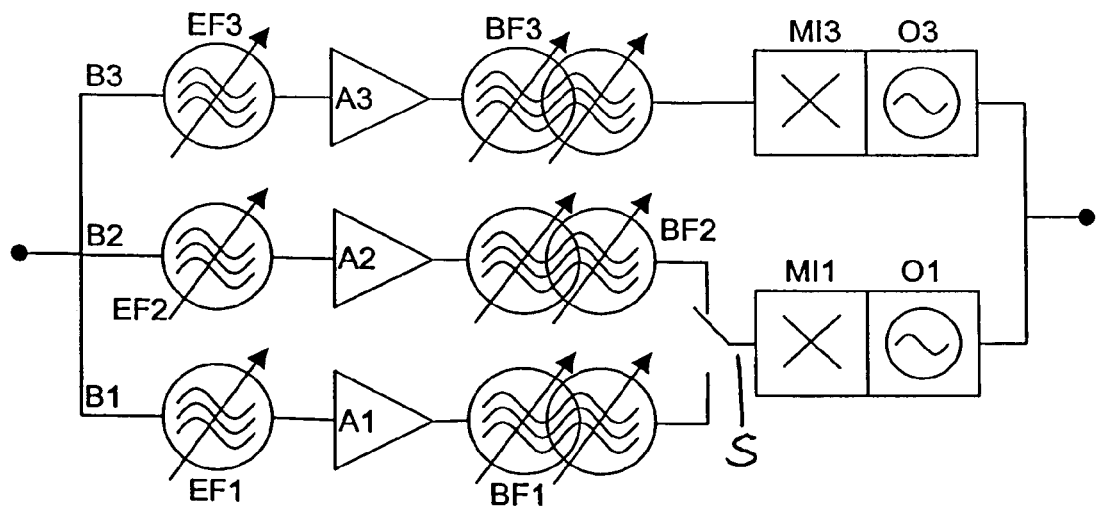
FIG. 2 shows the basic illustration of a three-band concept with two-band mixer/oscillator as is known from the prior art.
Figure 3:
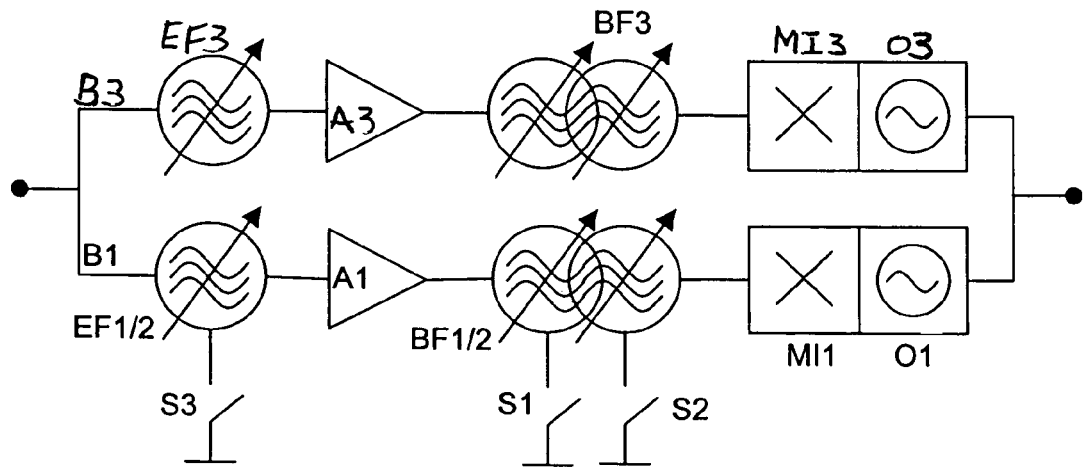
FIG. 3 shows the basic illustration of a switched two-band concept known from the prior art.
Figure 4:
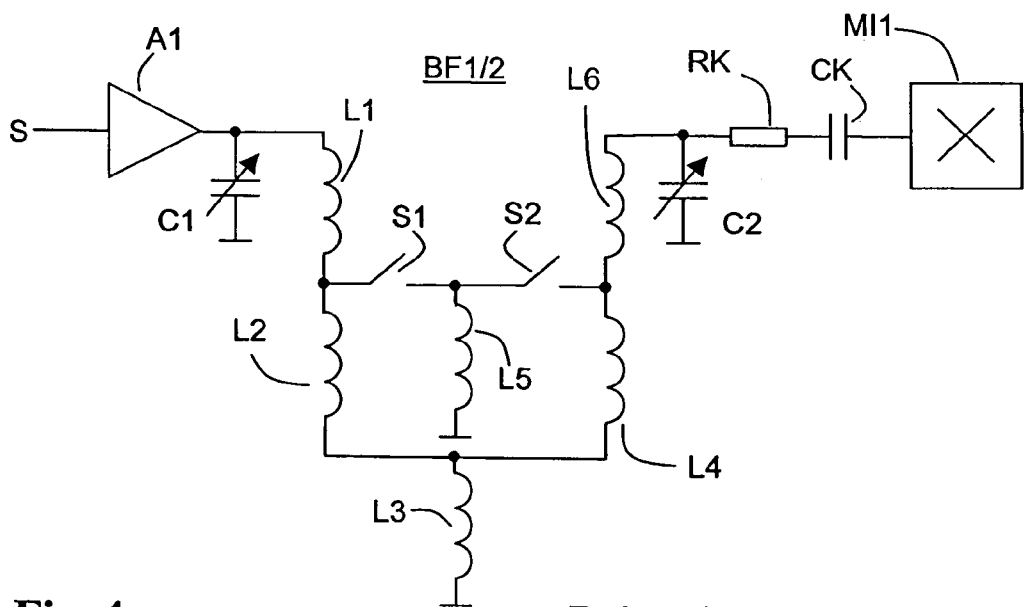
FIG. 4 shows a diagrammatic illustration of the practical embodiment of a bandpass filter according to the switched two-band concept from FIG. 3.
Figure 5:
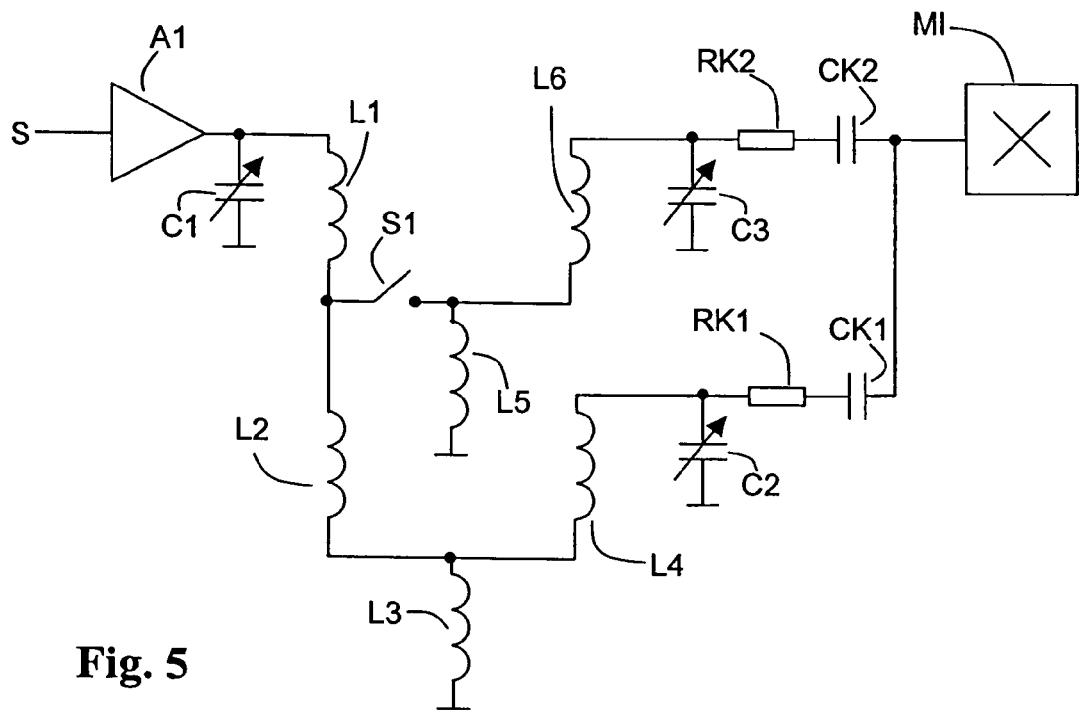
FIG. 5 shows a diagrammatic illustration of an exemplary embodiment of the switched bandpass filter according to the invention.

FIG. 5 shows a diagrammatic illustration of a simplified practical embodiment of the switchable tuneable bandpass filter according to the invention. An input signal S passes from an antenna (not shown in the figure) via an input filter (likewise not illustrated in the figure) to an input amplifier A1. In a first switch position of a switch S1, the switch S1 is open. The signal passes from the output of the input amplifier A1 to a first primary resonant circuit. The first primary resonant circuit is formed from a variable capacitance C1, the series circuit formed by two inductances L1 and L2 and also an inductance L3. In this case, the inductance L3 is a common reference point inductance for the first primary resonant circuit and a first secondary resonant circuit. In this switched position of the switch S1, the first secondary resonant circuit is formed by the inductance L4 and the variable capacitance C2. In order to obtain the desired property of the bandpass filter, the inductance formed from the series circuit formed by the inductances L1 and L2 of the first primary circuit expediently has exactly the same value as the inductance L4 of the first secondary resonant circuit. The inductance L3 forms a so-called inductive reference point coupling for the two first resonant circuits. The first resonant circuits can be tuned by varying the capacitances C1 and C2. The output of the first secondary resonant circuit is connected via coupling elements RK1 and CK1 to the input of a mixer MI, to which the signal is fed for further processing.

In a second switch position of the switch S1, the switch is closed. The second primary resonant circuit produced in this way is now formed by the variable capacitance C1 and the inductance L1, which are connected to a new common reference point inductance L5. In this case, the inductance L1 is a partial inductance of the first primary resonant circuit as exists when switch S1 is open. The second secondary resonant circuit is formed by an inductance L6 and a variable capacitance C3, which are connected to the common reference point inductance L5. The output of the second secondary resonant circuit is connected to the input of the mixer MI via coupling elements RK2 and CK2. In order to obtain the desired property of the bandpass filter in this switch position as well, the inductance L1 expediently has exactly the same value as the inductance L6. In the embodiment of the bandpass filter according to the invention, that part of the circuit which is not required when switch S1 is closed is not disconnected. This is possible because the reference point inductance L5 is very much smaller than the inductance L2. The components which are furthermore connected to the inductance L2 and belong to the first primary and secondary resonant circuits can thus essentially be disregarded. The second resonant circuit can be tuned by varying the capacitances C1 and C3. What has a particularly advantageous effect in this case is the fact that the coupling elements RK1, RK2, CK1 and CK2 can be optimized for the respective frequency range and, consequently, it is possible to achieve a constant amplitude response over both frequency ranges.

Figure 6:
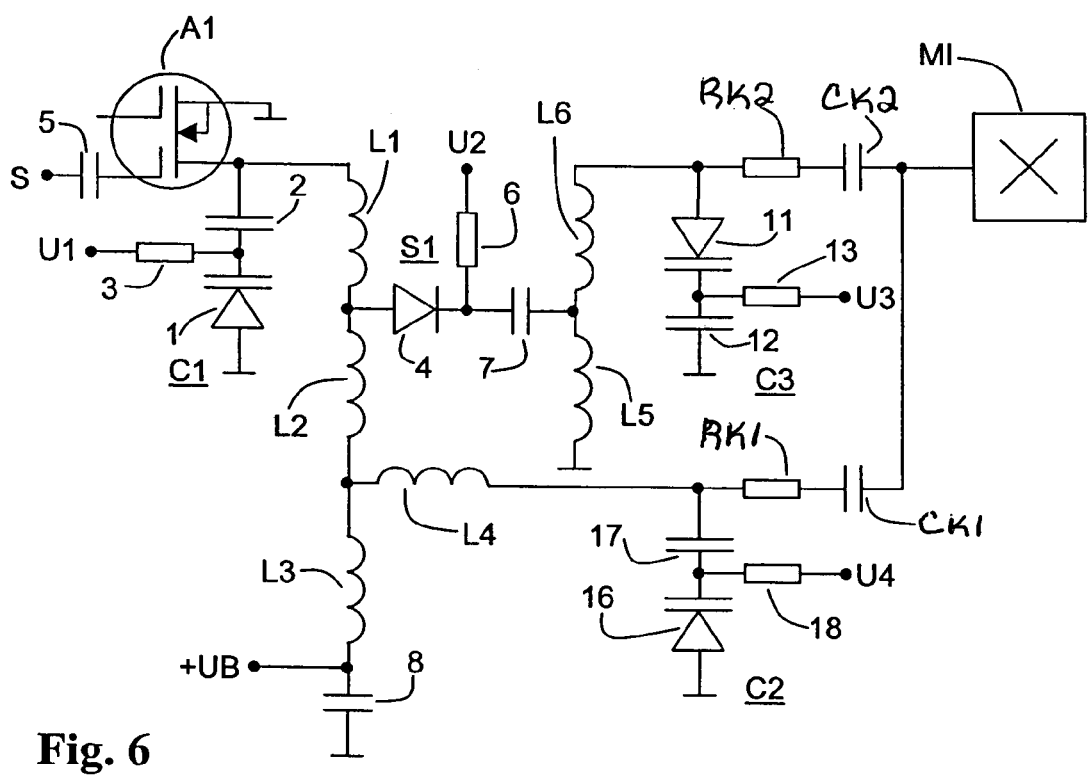
FIG. 6 shows an exemplary circuit of the switchable bandpass filter according to the invention from FIG. 5.

In an exemplary circuit of the switchable bandpass filter according to the invention in FIG. 6, a signal S passes from an antenna (not illustrated in the figure) via an input filter (likewise not illustrated in the figure) and via a coupling capacitor 5 to an input amplifier A1. The input amplifier A1 is essentially formed by a transistor. At the output of the amplifier A1, the variable capacitance C1 from FIG. 5 is formed by a tuning diode 1 and a capacitor 2, which are connected in series from the output of the amplifier to earth.

A tuning voltage U1 is passed to the cathode of the tuning diode 1 via a resistor 3. The signal furthermore passes to one connection of the inductance L1, to the second connection of which a switching diode 4 and an inductance L2 are connected. The switching diode 4 together with a resistor 6 and a capacitor 7 forms the switch S1 from FIG. 5. In order to open or close the switch S1, a switching voltage U2 is applied to the cathode of the switching diode 4 via the resistor 6. The switch is closed or open depending on whether the p-n junction of the switching diode 4 is forward- or reverse-biased. In this case, the capacitor 7 serves for decoupling the rest of the circuit from the switching voltage.

If the switching voltage U2 is lower at least by the forward voltage of the diode than an operating voltage UB, which passes via an inductance L3 to the inductance L2 and thus to the switching diode 4, the switch is closed and the second secondary resonant circuit is switched in. In this case, a capacitor 8 serves for avoiding a short circuit between the operating voltage UB and earth and at the same time represents an RF connection of the reference point inductance L3 to earth. As mentioned in the description of FIG. 5, the inductance L2 is very much greater than the inductance L5. Therefore, L2 and the further components of the first secondary resonant circuit that are connected to the inductance L2 can be disregarded for the further function. The capacitance C1 and the inductance L1 form a part of the second primary resonant circuit from FIG. 5. Via the closed switch S1, the signal passes to the reference point inductance L5 and also to an inductance L6 of the second secondary resonant circuit. From the inductance L6, the signal furthermore passes to a variable capacitance C3, which, in the same way as the variable capacitance C1, is formed from the series circuit formed by a tuning diode 11 and a capacitance 12. A further tuning voltage U3 is applied to the cathode of the tuning diode 11 via a resistor 13. From the inductance 16, the signal then passes to the input of a mixer MI via coupling elements RK2 and CK2.

If the switching voltage U2 of the switch S1 is greater than or equal to the operating voltage UB, the switching diode 4 turns off and the switch is open. In this case, the signal passes from the input amplifier A1 via the series circuit formed by the inductances L1 and L2 to a first connection of the reference point inductance L3. The capacitor C1 and the inductances L1 and L2 now form a part of the first primary resonant circuit from FIG. 5. A second connection of the reference point inductance L3 is at operating voltage potential and is connected to earth in terms of RF by means of the capacitor 8. From the first connection of the reference point inductance L3, the signal passes via an inductance L4 to a variable capacitance C2. In the same way as the variable capacitances C1 and C3 described above, the variable capacitance C2 is formed from the series circuit formed by a tuning diode 16 and a capacitor 17. A tuning voltage U4 is applied to the cathode of the tuning diode 16 via a resistor 18. From the inductance L4, the signal passes to the input of the mixer MI via coupling elements RK1 and CK1.

The tuning voltages U1, U3 and U4 may expediently be combined to form a single tuning voltage, but this is not necessary for the function of the circuit.

What is claimed is:

1. A tuneable switchable bandpass filter for a first and second frequency range having an input, an output, a first primary resonant circuit and a first secondary resonant circuit for providing a signal at the first frequency range, a second primary resonant circuit and a second secondary resonant circuit for providing a signal at the second frequency range, and a switch moveable between a first open position and a second closed position wherein upon said switch being in said first open position said first primary resonant circuit and said first secondary resonant circuit are coupled between said input and said output to provide said signal at said first frequency range and upon said switch being in said second closed position, said second primary resonant circuit and said second secondary resonant circuit are coupled between said input and said output to provide said signal at said second frequency, wherein the first and the second secondary resonant circuits are non-switchably connected to one another at the output via coupling elements.

2. The bandpass filter of claim 1, wherein the resonant circuits comprise inductances and capacitances and in that the capacitances can be varied responsive to control signals.

3. The bandpass filter of claim 1, wherein the first and second primary and secondary resonant circuits are in each case coupled via first and second reference point inductances.

4. The bandpass filter of claim 3, wherein the first primary resonant circuit has at least two series-connected partial inductances in addition to the first reference point inductance, and in that the second secondary resonant circuit can be switched in between the partial inductances.

5. The bandpass filter of claim 4, wherein the partial inductances of the first primary resonant circuit and the second reference point inductance are dimensioned in such a way that the first secondary resonant circuit can be inductively decoupled via the partial inductance of the first primary resonant circuit, which inductance does not belong to the second primary resonant circuit.

6. The bandpass filter of claim 4, wherein the sum of the partial inductances of the first primary resonant circuit essentially has exactly the same value as the corresponding inductance of the first secondary resonant circuit, and in that an effective partial inductance of the second primary resonant circuit essentially has exactly the same value as the corresponding inductance of the second secondary resonant circuit.

7. The bandpass filter of claim 1, wherein the coupling elements contain capacitors and/or resistors.

8. The bandpass filter of claim 1, wherein the coupling elements can be adapted for the respective frequency range.

* * * * *